United States Patent [19]

Schiller

[11] 4,011,436
[45] Mar. 8, 1977

[54] MULTIPLE LEVEL PREDETERMINING SYSTEM

[75] Inventor: Robert J. Schiller, Simsbury, Conn.

[73] Assignee: Veeder Industries, Inc., Hartford, Conn.

[22] Filed: Feb. 13, 1976

[21] Appl. No.: 657,854

[52] U.S. Cl. .................. 235/92 PE; 235/92 EV; 235/92 R; 235/92 FL; 328/48

[51] Int. Cl.² ................. G06M 3/02; H03K 21/36

[58] Field of Search ...... 235/92 PE, 92 CC, 92 FL, 235/92 EV; 328/48

[56] References Cited

UNITED STATES PATENTS

| | | | |
|---|---|---|---|
| 3,577,188 | 5/1971 | Thomson et al. | 235/92 PE |
| 3,612,976 | 10/1971 | Tripp | 235/92 PE |
| 3,750,603 | 8/1973 | Martin | 235/92 PE |
| 3,774,056 | 11/1973 | Sample et al. | 328/48 |
| 3,825,153 | 7/1974 | Patrick et al. | 235/92 FL |
| 3,946,219 | 3/1976 | Lucas | 235/92 FL |

Primary Examiner—Joseph M. Thesz
Attorney, Agent, or Firm—Prutzman, Hayes, Kalb & Chilton

[57] ABSTRACT

An electronic multiple level predetermining system having a single level predeterminer adapted to be indexed for accumulating a primary count and for generating a primary predetermining signal when the accumulated count reaches a primary predetermining level and a control system operable by an input pulse to index the predeterminer one count in one direction for accumulating a primary count of the input pulses and through an additional bidirectional counting cycle for generating a secondary predetermined signal at a secondary predetermining level.

12 Claims, 3 Drawing Figures

MULTIPLE LEVEL PREDETERMINING SYSTEM

BRIEF SUMMARY OF THE INVENTION

The present invention relates generally to predetermining systems adapted to be stepped for accumulating a count and operable for generating a control signal at one or more predetermined levels or counts, and relates more particularly to a new and improved multiple level predetermining system.

It is a primary aim of the present invention to provide a new and improved electronic multiple level predetermining system having an economical and reliable electronic circuit employing commercially available components.

It is another aim of the present invention to provide a new and improved multiple level predetermining system operable for generating a primary predetermining signal at a first manually established primary count and at least one secondary predetermining signal at a secondary count related to the primary count. In accordance with the present invention, each secondary count can differ from the primary count by a fixed or manually established number of steps.

It is a further aim of the present invention to provide a new and improved multiple level predetermining system employing a novel control system in combination with a single level predetermining system for converting the single level predetermining system to multiple level predetermining capability.

It is another aim of the present invention to provide in a predetermining system operable for generating a primary predetermining signal at a primary predetermined count, a new and improved control system for the predetermining system for establishing at least one additional or secondary predetermining signal at another secondary count differing from the primary count by an established number of steps.

Other objects will be in part obvious and in part pointed out more in detail hereinafter.

A better understanding of the invention will be obtained from the following detailed description and the accompanying drawings of illustrative applications of the invention.

DESCRIPTION OF THE PREFERRED EMBODIMENTS

Figure 1:
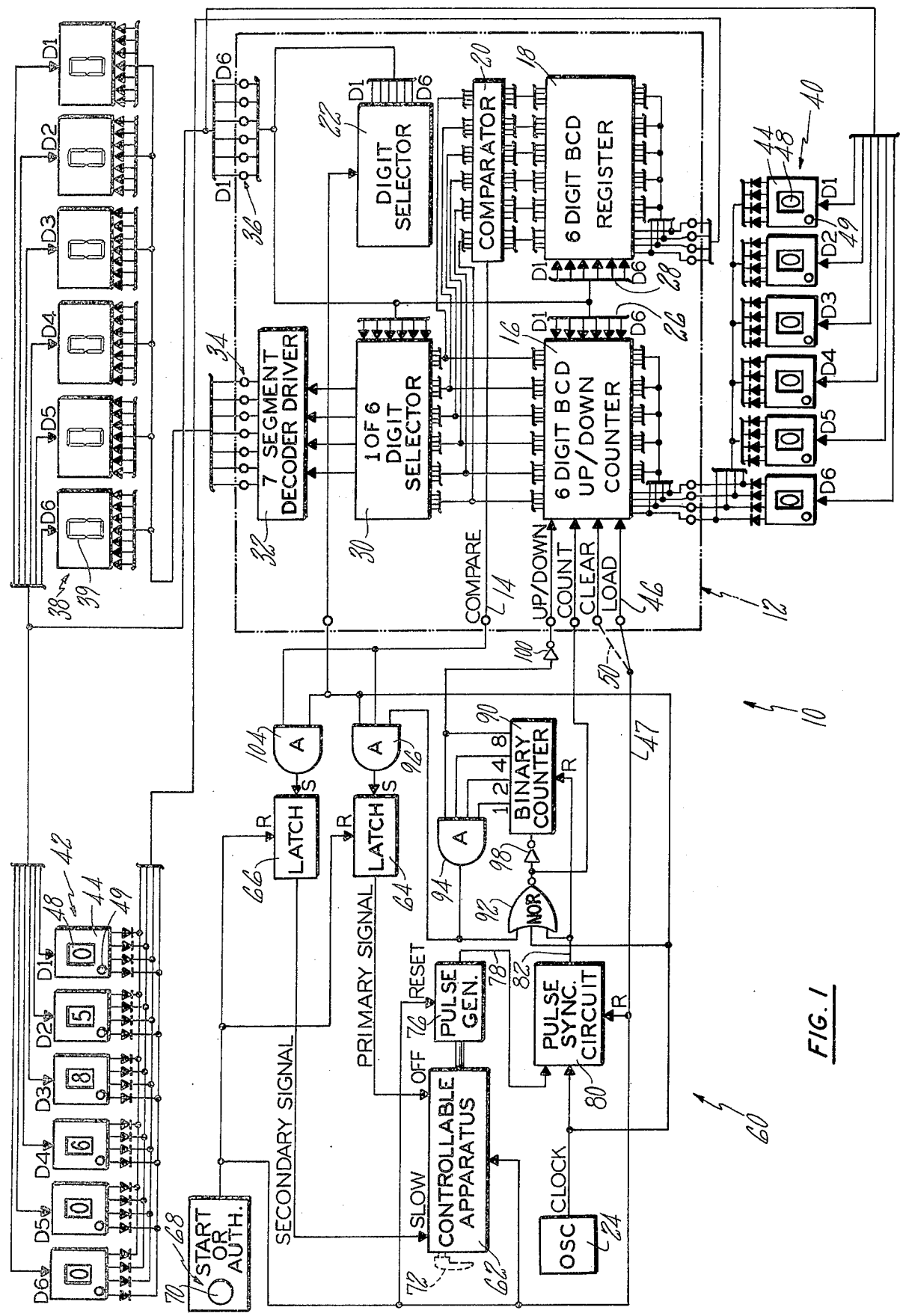
FIG. 1 is a functional diagram or schematic of an embodiment of a multiple level predetermining system of the present invention.
Figure 2:
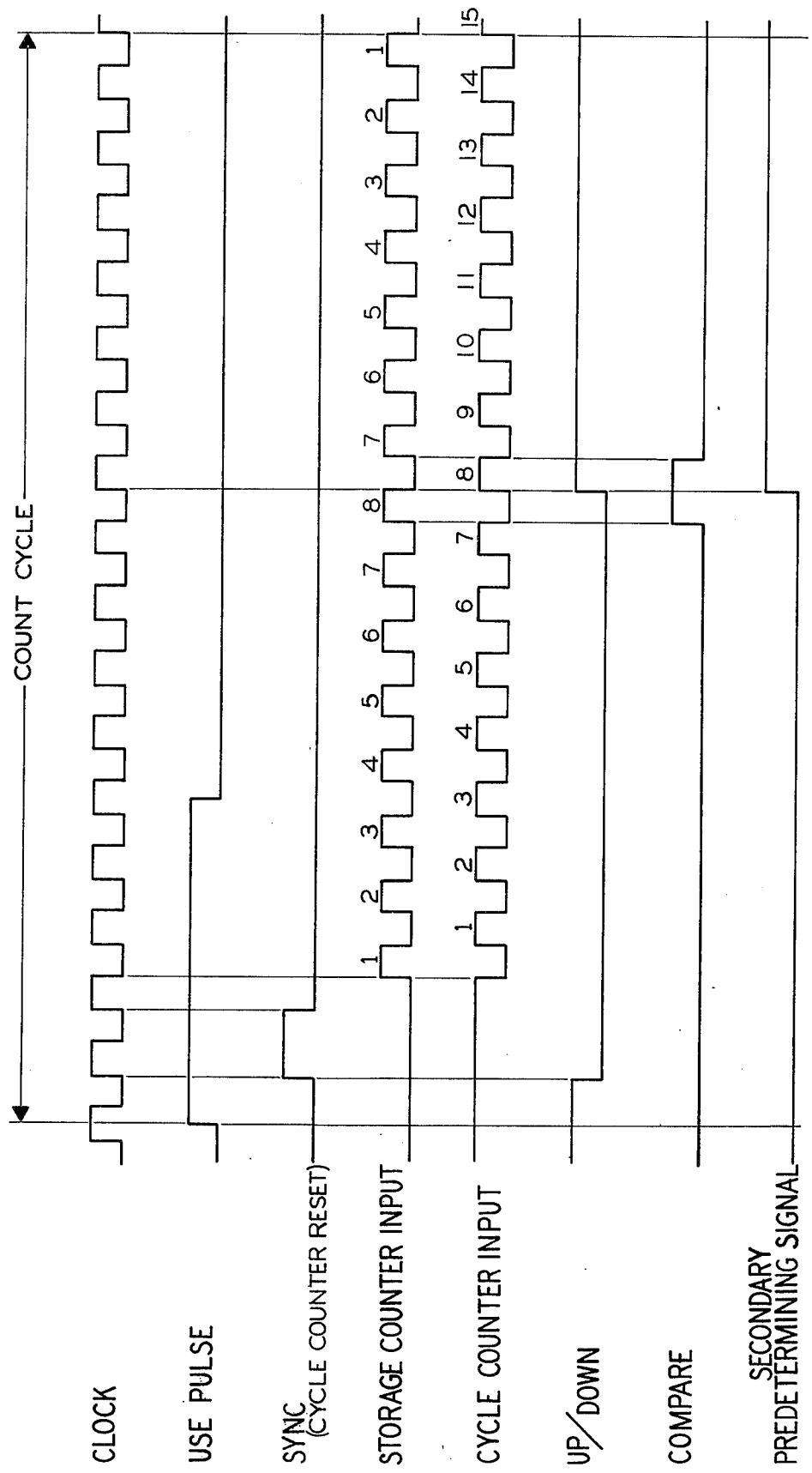
FIG. 2 is a timing chart showing nonvariable and representative variable signals of the system of FIG. 1.

Referring now to the drawings in detail wherein like numerals are used to designate like parts and referring particularly to FIGS. 1 and 2, there is shown a multiple level predetermining system 10 incorporating an embodiment of the present invention. The system 10 shown employs a commercially available solid state predetermining circuit 12 (e.g., an integrated circuit such as the MK 50395N MOS six-decade counter/display decoder chip sold by Mostek Corporation) as its core circuit. The core circuit 12 has a comparator 20 which is connected for generating a compare or predetermining signal in its "Compare" output 14 when the BCD count of a six-decade BCD counter 16 of the circuit 12 equals the count stored in a six-decade register 18 of the circuit 12. A decade or digit selector 22 of the circuit 12 is connected to be stepped by an external oscillator or clock 24, and the digit selector 22 is connected for addressing the six BCD decades or digits of the counter 16 and register 18 in synchronism through a six digit sequence for comparing their BCD outputs with the comparator 20 and for entering BCD data into the counter 16 via a BCD counter input 26 and BCD data into the register 18 via a BCD register input 28. The digit selector 22 is also connected to a counter output digit selector 30 for reading the BCD output of each decade or digit of the counter 16 via the selector 30, a seven segment decoder-driver 32 and a seven lead decoder-driver read or display output 34.

A readout register 38 having six seven-segment numeral indicators 39 is connected to the display output 34 and to a six lead digit select output 36 of the core circuit 12 for displaying the six digit BCD count of the counter 16. Similarly, a pair of data entry registers 40, 42, each having six BCD selector switches 44, are connected to the digit selector output 36 and respectively to the BCD input 26 of the counter 16 and BCD input 28 of the register 18 for selectively entering BCD counts into the six decades of the counter 16 and six decades of the register 18. A BCD count set into the data entry register 40 is entered into the counter 16 when an entry signal is applied to the "Load" input 46 of the counter 16 via an external electrical lead 47, whereas the data entry register 42 is connected for continually loading the register 18 with the count set therein.

The BCD selector switches 44 may, for example, be BCD switches of the type shown and described in U.S. Pat. No. 3,445,636 of Joseph A. Richards entitled "Single Wheel Counter Circuit" and dated May 20, 1969, and having a number wheel 48 providing a numerical readout of the binary switch position and suitable means such as a push button 49 for selectively setting the switch and number wheel. The BCD switches 44 are suitably isolated, as by the provision of diodes in each output lead of each switch 44, to prevent feedback through inactive switches and such that the BCD output generated during the corresponding digit cycle is dependent solely on the setting of the active BCD switch 44 of each register 40, 42. The data entry registers 40, 42 may be identical and, if desired, a single BCD data entry register in combination with a suitable selector circuit (not shown, but which may be controlled by the entry signal transmitted via the lead 47 to the counter "Load" input 46 if desired) may be used to preload the counter 16 (when the entry signal is applied to the counter "Load" input 46) and then used to load the BCD register 18 with a different BCD count (after resetting the BCD switches 44 of the data entry register as desired). Or, if the counter 16 is to be initially set to zero rather than some pre-established count, a BCD entry circuit for the counter 16 is unnecessary and the entry signal transmitted via the lead 47 is then applied to a "Clear" input 50 of the counter 16 (as shown in broken lines in FIG. 1) for clearing or resetting the counter 16 to zero.

A predetermining control circuit 60 is connected to the core circuit 12 for operating the core circuit for generating predetermining signals at two different levels or accumulated usage counts of the counter 16. More particularly, a primary predetermining signal is generated when the storage counter 16 has been indexed to accumulate a pre-established primary usage count (equal to the count preset into and thereby pre-established with the BCD register 18) which directly corresponds to the use or operation of some associated apparatus 62 (identified generally in FIG. 1 as "Controllable Apparatus"). An additional or secondary predetermining signal is generated at a secondary usage count of the counter 16 which differs from the pre-established primary usage count by a fixed established number of steps or counts.

The associated apparatus 62 may, for example, be a fuel pump operable for delivering fuel, in which case the primary predeterminating signal generated at a preset primary usage count of the pump (preset with the BCD entry register 42) would be used to terminate the delivery of fuel after the preset cost (or volume) amount of fuel is delivered. The secondary predetermining signal would be used to slow down the delivery of fuel in advance of the preset amount so that the primary or final stage fuel cutoff would be accurate. The multiple level predetermining system 10 could be used in various other ways with various types of associated apparatus 62, for example reeling and unreeling apparatus, bulk handling apparatus and batch counting apparatus where multiple level control is desired at different stages of an operating cycle of the apparatus. However, for purposes of explanation, the apparatus 62 is portrayed in FIG. 1 as being turned "off" with the primary or final stage predetermining signal applied to the apparatus 62 via a suitable primary or final stage latch 64, and as being slowed by the secondary or first stage predetermining signal applied to the apparatus 62 via a first or secondary stage latch 66.

A suitable start or authorization switch 68 having a button 70 is shown provided for selectively manually resetting the predetermining control circuit 60, including the latches 64, 66, and to apply an entry signal via the lead 47 to the core circuit 12 (as previously described for either loading the counter 16 with the count preset into the entry register 40 or for clearing the counter 16). The start or authorization switch is also shown connected to the associated apparatus 62, for example either to condition the apparatus for being activated or for activating the apparatus. If the start or authorization signal only conditions the apparatus for being activated, the apparatus 62 can then be activated by other suitable means such as a handle 72 shown in broken lines in FIG. 1.

A pulse generator 76 is connected to be suitably driven by the associated apparatus 62 to generate an electrical pulse or signal in its output 78 for each predetermined increment of operation or use of the associated apparatus 62. For example where the apparatus 62 is a fuel pump, the pulse generator 76 is connected for generating a pulse for each one cent cost amount or each one-tenth of a gallon amount of fuel delivered. Where the associated apparatus is a wire, thread or other line reeling or unreeling device, the pulse generator 76 could be connected for being driven to generate a pulse for each one inch or one foot increment of line reeled to or from the device. It is contemplated that the pulse generator may be designed and connected for being reset to a desired starting condition when the start or authorization switch 68 is operated and so that the first electrical pulse of the succeeding operational cycle of the apparatus 62 is generated after a desired initial increment of use or operation of the apparatus 62.

A suitable synchronizing circuit 80, connected to be operated by output pulses from the pulse generator 76 and from the oscillator or clock 24 provides, as shown in the timing chart of FIG. 2, a timed count signal of a desired short duration for each pulse generated by the pulse generator 76. Each such count signal is applied via the output lead 82 for resetting a straight binary counter 90 to binary 0 and for temporarily closing a NOR control gate 92 for the counter 90 to prevent indexing the counter 90 until after it is fully reset. A count cycle is thereby initiated which has a maximum duration of seventeen clock pulse cycles (as can be seen upon reference to the timing diagram of FIG. 2); accordingly, the clock frequency is established to be at least seventeen times the maximum operating pulse frequency of the pulse generator 76. And for example, a clock frequency of 20 kHz may be used where the predetermining system 10 is used with a conventional fuel pump having a pulse generator connected for generating a pulse for each one cent cost amount of fuel dispensed. The synchronizing circuit 80 is also preferably connected to be reset by the start or authorization switch 68 to properly condition the synchronizing circuit for being operated by the initial pulse generated by the pulse generator 76.

After the binary counter 90 is reset by a count signal from the synchronizing circuit 80, the counter is stepped from its reset or binary 0 count to its binary 15 count by the next fifteen clock signals transmitted via the NOR gate 92, whereupon a hold signal is transmitted via an AND gate 94 to close the NOR gate 92 and thereby hold the binary counter 90 at its maximum or binary 15 count. The hold signal transmitted via the AND gate 94 is also applied to a control AND gate 96 for the primary latch 64 and whereby the primary latch 64 cannot be set during a count cycle of the binary counter 90.

The NOR gate 92 is connected to the "Count" lead of the BCD storage counter 16 so that each of the 15 clock pulses applied to the binary counter 90 is also applied for indexing the BCD storage counter 16. The circuit provides (through the provision of an inverter 98 in the shown embodiment) for indexing the storage counter 16 slightly before (one-half clock cycle before) the counter 90, and whereby the storage counter 16 is indexed and any resulting "Compare" signal is generated before the counter 90 is indexed. When the counter 90 reaches binary 15, the AND gate 94 is opened and the NOR gate 92 is closed to discontinue the counting cycle.

The binary 8 readout lead of the straight binary counter 90 is connected via an inverter 100 to an "Up/-Down" input to the storage counter 16 so that the first eight clock pulses applied to the storage counter 16 during each counting cycle index the storage counter 16 in the additive or up direction and the last seven clock pulses index the storage counter 16 in the down or subtractive direction, a net count of one in the additive direction. Thus, for each count cycle, the storage counter is indexed or stepped one usage count in the additive direction and to thereby accumulate a count of the number of pulses generated by the pulse generator 76 and therefore the usage or operation of the apparatus 62. If after the completion of any count cycle, a "Compare" signal is generated by the comparator 20

(signifying that the accumulated usage count of the storage counter 16 equals the count of the storage register 18), the primary latch 64 is set by the "Compare" signal (during the next clock pulse) to transmit a primary predetermining signal to the apparatus 62.

An AND gate 104 controlling the operation of the secondary predetermining signal latch 66 is connected so that a "Compare" signal generated by the comparator 20 either during a count cycle or after the completion of a count cycle will set the latch 66 (during a clock pulse) to transmit a secondary predetermining signal to the apparatus 62. Accordingly, during any count cycle that the storage counter 16 is temporarily stepped either to or through a count equal to the count of the storage register 18, the latch 66 will be set to transmit a secondary predetermining signal to the apparatus 62. Thus, the latch 66 will be set during the fifteen step count cycle that the storage counter 16 is indexed to a usage count which is seven steps or counts less than the count of the storage register 18. Also, during each of the seven subsequent count cycles, another signal will be transmitted via the AND gate 104 for setting the latch 66. Such additional signals can be used as additional predetermining signals if desired or those signals may be merely used as redundant signals for ensuring that the latch 66 is set.

It can be seen that the storage counter 16 can be initially set at binary 0 (via the "Clear" lead) and then indexed in the additive direction (or in the subtractive direction if desired by deleting the inverter 100) to generate an advanced secondary predetermining signal and then a primary predetermining signal at a usage count equal to the count of the storage register 18 (which may be set at binary 0 if desired). Alternatively, the storage counter 16 can be initially set (via the "Load" lead) at a count established by the entry register 40 and then indexed either in the additive direction or in the subtractive direction (by deleting the inverter 100) to generate the primary predetermining signal at the count of the storage register 18 (which may be set at binary 0 if desired) and the advanced secondary predetermining signal.

A substitute auxiliary binary counter (in place of the auxiliary binary counter 90) could be employed to provide a count cycle less or greater than the fifteen step count cycle described and for example having a count cycle of 127 steps and whereby the secondary predetermining signal is initially generated at a usage count level 63 usage counts in advance of the pre-established primary usage count of the storage register 18. One or more additional secondary predetermining signals may be generated at intermediate secondary usage count levels within the available differential count range (e.g., a differential count range of 63 steps using a 127 step count cycle) through the provision of a suitable binary selector circuit connected to the binary readout leads of the auxiliary counter for timely controlling the operation of each corresponding secondary predetermining signal latch. An example 120 of a predetermining control circuit having three predetermining levels including two secondary predetermining signals with at least one of those secondary signals being generated at an intermediate usage count level is shown in part in FIG. 3.

Figure 3:
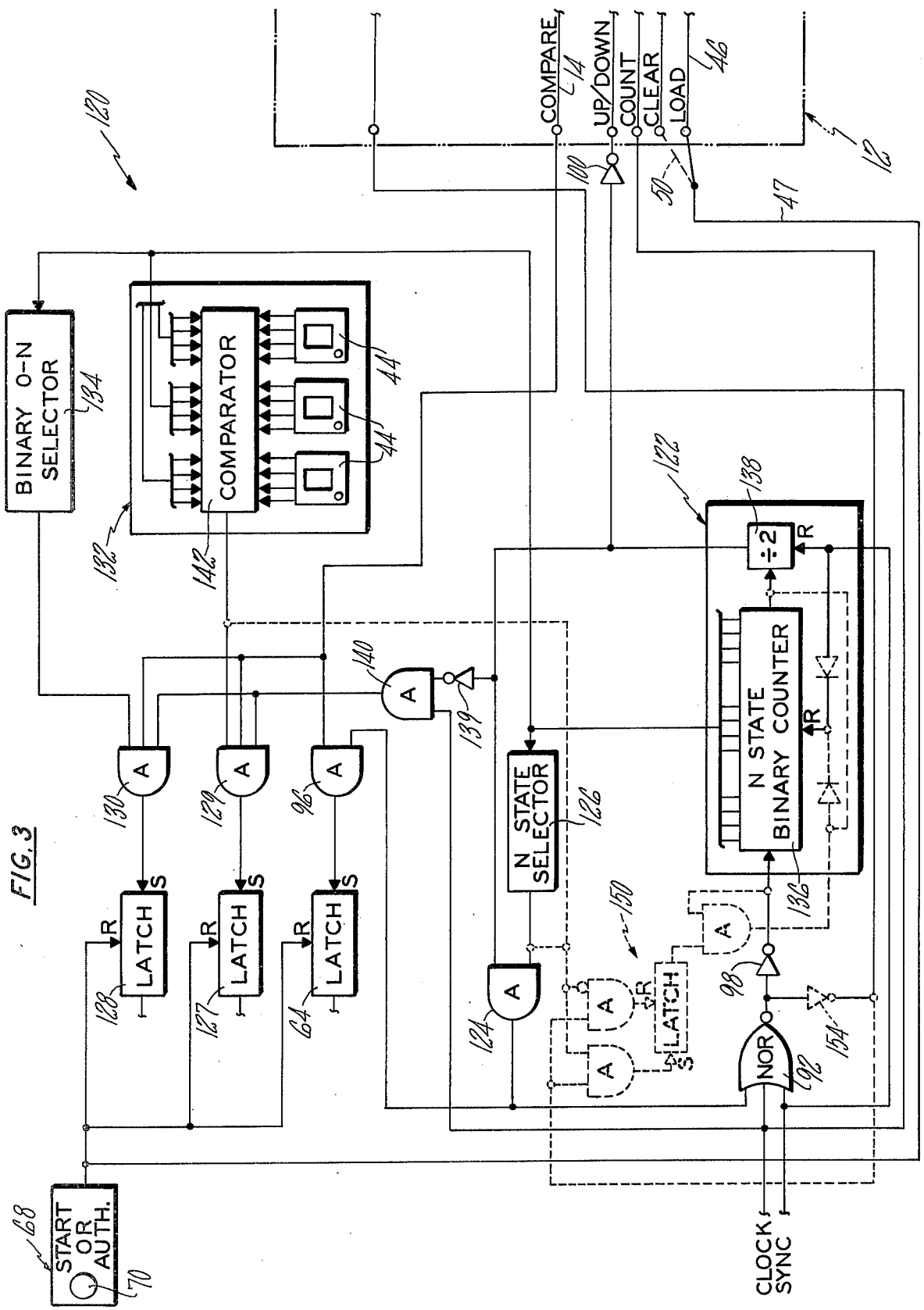
FIG. 3 is a partial functional diagram or schematic of a modified control circuit for the system of FIG. 1.

Referring to FIG. 3, the predetermining control circuit 120 employs an auxiliary binary counter 122 which will be described for purposes of a generalized disclosure as having 2N binary states and as being adapted to be indexed 2N-1 steps or counts from its binary 0 count or state to its maximum binary count at its 2N binary state (where N is any whose number). An AND control gate 124 (which serves the same function as the AND control gate 94 in the predetermining control circuit 60 of FIG. 1) is connected to a primary N state binary counter section 136 of the auxiliary counter 122 (having N binary states) via a suitable N state selector 126 and to a higher order 2 state binary counter section 138 so that the auxiliary counting cycle is terminated (via the AND gate 124 and the NOR control gate 92) when the auxiliary counter 122 reaches its 2N binary state.

The primary signal latch 64 in the control circuit 120 is connected to be set in the same manner as it is in the circuit of FIG. 1. The two secondary signal latches 127, 128 are set via respective AND gates 129, 130 when a "Compare" signal is generated at respective secondary differential counts established by their respective binary selector circuits 132, 134 which are connected to the readout leads of the N state counter section 136. Also, the 2 state binary counter section 138 is connected via an inverter 139 and an AND gate 140 to permit setting the latches 127, 128 only during the first count phase of the two phase count cycle of the N state counter section 136. Otherwise, each secondary latch 127, 128 could be untimely set by a "Compare" signal occurring during the second count phase of the N state counter section 136.

The binary selector circuits 132, 134 may have fixed (e.g. hard wired) selector circuits for transmitting a "Compare" signal to the respective AND gates 129, 130 at a fixed binary count of the primary N state counter section 136. Alternatively, either or both of the binary selector circuits 132, 134 may be made to be manually adjustable and, for example, employ a bank of one or more BCD selector switches 44 of the type employed in the registers 40, 42 for manually establishing each secondary predetermining level, in which event, the primary binary counter section 136 is preferably a BCD counter having BCD outputs which may be directly compared via a suitable comparator 142 to the BCD outputs of the BCD selector switches 44.

The selector circuit 132 or 134 used to establish the secondary predetermining count level having the greatest usage count differential relative to the primary predetermining count level established by the storage register 18 may also be used (in place of the N state selector 126) to control the number of steps in the count cycle and to provide a minimum required number of steps for generating the secondary predetermining signals. For example, the additional circuit 150 shown in broken lines in FIG. 3 could be used in place of the N state selector 126 for using the binary selector 132 for that purpose. In that regard, the compare output of the binary selector 132 is connected for controlling the AND gate 124 (in place of the N state selector 126) for terminating the count cycle after two successive count phases, each having a number of steps manually established by the bank of BCD selector switches 44 of the binary selector 132. And, the first step pulse of the second count phase is employed for resetting the primary binary counter section 136 to binary 0 and to index or step the higher order binary counter section 138 to binary 1.

The predetermining control circuit 120 therefore may be used for generating each of a plurality of secondary predetermining signals in advance of the primary predetermining signal, with the primary usage count being accumulated either in the additive direction (by employing the inverter 100) or in the subtractive direction (by deleting the inverter 100) as described with reference to the embodiment of FIG. 1. Also, by deleting the inverter 98 in the count input line to the auxiliary binary counter 122 and employing instead an inverter 154 (shown in broken lines in FIG. 3) in the count input line to the primary counter 16, each secondary predetermining signal would be generated subsequent to rather than in advance of the primary predetermining signal. The inverter 100 in the up/down lead to the counter 16 then would be employed where the usage count is to be accumulated in the subtractive direction and would be deleted where the usage count is to be accumulated in the additive direction.

As will be apparent to persons skilled in the art, various modifications, adaptations and variations of the foregoing specific disclosure can be made without departing from the teachings of the present invention.

I claim:

1. A multiple level predeterming system having a bidirectional predetermining counter operable for being indexed for accumulating a primary count and for generating a primary predetermining control signal when the primary accumulated count reaches a first predetermined accumulated count, and a predetermining control system for automatically generating at least one additional secondary predetermining control signal when the primary count reaches an accumulated count which differs from said first count by a predetermined count differential, the predetermining control system comprising indexing means for indexing the bidirectional counter in a first direction and then the opposite direction through a secondary counting cycle having a plurality of N-1 counts in each direction at least equal to said count differential, and predetermining signal control means for generating a secondary predetermining control signal if the accumulated count equals said first count when the counter is indexed said count differential during a secondary counting cycle.

2. A multiple level predetermining system according to claim 1 wherein the indexing means is operable through a cycle thereof for indexing the predetermining counter a predetermined count increment for accumulting said primary count and for indexing the predetermining counter through said secondary counting cycle.

3. A multiple level predetermining system according to claim 2 wherein the indexing means comprises binary counter means, and means for indexing the binary counter means 2N-1 counts from a first count to a second count and index the predetermining counter therewith a one count increment in one direction for accumulating said primary count and through said secondary counting cycle having N-1 counts in each direction.

4. A multiple level predetermining system according to claim 3 wherein the predetermining signal control means comprises binary selector means connected to the binary counter means for selecting said count differential.

5. A multiple level predetermining system according to claim 4 wherein the binary selector means is adjustable to adjustably establish said count differential.

6. A multiple level predetermining system according to claim 2 wherein the indexing means comprises auxiliary counter means and means for indexing the auxiliary counter means 2N-1 counts from a first count to a second count and index the predetermining counter therewith a one count increment in one direction for accumulating said primary count and through said secondary counting cycle having N-1 counts in each direction.

7. A multiple level predetermining system according to claim 1 wherein the bidirectional predetermining counter comprises a bidirectional binary counter and means for generating the primary predetermining control signal when the accumulated count of the binary counter reaches said first count; and wherein the indexing means comprises an oscillator operatively connected for indexing the binary counter through said secondary counting cycle.

8. A multiple level predetermining system according to claim 7 wherein the indexing means comprises an auxiliary binary counter operatively connected to be indexed by the oscillator with the predetermining binary counter, and indexing control means for selectively operatively connecting the oscillator for indexing the predetermining binary counter and the auxiliary binary counter together and operable when the auxiliary binary counter reaches a first predetermined count for operatively disconnecting the oscillator from the predetermining and auxiliary binary counters.

9. A multiple level predetermining system according to claim 8 wherein the indexing control means is operable by a count signal to reset the auxiliary binary counter to a second predetermined count and for connecting the oscillator for indexing the predetermining and auxiliary binary counters together until the auxiliary binary counter reaches said first predetermined count.

10. A multiple level predetermining system according to claim 8 wherein the auxiliary binary counter is connected to the bidirectional binary counter for reversing its counting direction during said secondary counting cycle after said first N-1 counts thereof.

11. A multiple level predetermining system according to claim 1 wherein the predetermining control system is operable for automatically generating a plurality of secondary predetermining control signals when the primary accumulated count differs from said first count by predetermined count differentials respectively.

12. A multiple level predetermining system according to claim 1 wherein said count differential is N-1.

* * * * *